(12) United States Patent
Leomant et al.

(10) Patent No.: US 11,682,704 B2
(45) Date of Patent: Jun. 20, 2023

(54) METHOD OF PRODUCING A SEMICONDUCTOR DEVICE

(71) Applicant: Infineon Technologies Austria AG, Villach (AT)

(72) Inventors: Sylvain Leomant, Poertschach am Woerthersee (AT); Georg Ehrentraut, Villach (AT); Maximilian Roesch, St. Magdalen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/714,556

(22) Filed: Apr. 6, 2022

(65) Prior Publication Data

US 2022/0231136 A1 Jul. 21, 2022

Related U.S. Application Data

(62) Division of application No. 16/561,585, filed on Sep. 5, 2019, now Pat. No. 11,316,020.

(30) Foreign Application Priority Data

Sep. 6, 2018 (EP) .................................... 18193028

(51) Int. Cl.
*H01L 21/00* (2006.01)
*H01L 29/40* (2006.01)
(Continued)

(52) U.S. Cl.
CPC ...... *H01L 29/407* (2013.01); *H01L 21/02164* (2013.01); *H01L 21/02236* (2013.01);
(Continued)

(58) Field of Classification Search
CPC ............. H01L 29/407; H01L 21/02164; H01L 21/02236; H01L 21/02274; H01L 21/765;
(Continued)

(56) References Cited

U.S. PATENT DOCUMENTS 6,498,382 B2 12/2002 Hirler et al.
8,319,278 B1 11/2012 Zeng et al.
(Continued)

FOREIGN PATENT DOCUMENTS

EP 2955758 A1 12/2015

*Primary Examiner* — Richard A Booth
(74) *Attorney, Agent, or Firm* — Murphy, Bilak & Homilier, PLLC (57) ABSTRACT

A method includes: forming a trench in a first major surface of a semiconductor substrate, the trench having a base and a side wall extending from the base to the first major surface; forming a first insulating layer on the trench base and side wall; forming a sacrificial layer on the first insulating layer on the trench side wall; forming a second insulation layer on the sacrificial layer; inserting conductive material into the trench that at least partially covers the second insulation layer; selectively removing portions of the second insulation layer uncovered by the conductive material; selectively removing the sacrificial layer to form a recess that is positioned adjacent the conductive material in the trench and that is bounded by the first insulation layer and the second insulating layer; and forming a third insulating layer in the trench that caps the recess to form an enclosed cavity in the trench.

20 Claims, 9 Drawing Sheets

(51) Int. Cl.
  *H01L 29/78*  (2006.01)
  *H01L 29/10*  (2006.01)
  *H01L 21/02*  (2006.01)
  *H01L 21/765* (2006.01)
  *H01L 29/739* (2006.01)

(52) U.S. Cl.
  CPC ...... *H01L 21/02274* (2013.01); *H01L 21/765* (2013.01); *H01L 29/1095* (2013.01); *H01L 29/408* (2013.01); *H01L 29/7813* (2013.01); *H01L 29/7397* (2013.01)

(58) Field of Classification Search
  CPC ............... H01L 29/1095; H01L 29/408; H01L 29/7813; H01L 29/7397
  See application file for complete search history.

(56) References Cited

U.S. PATENT DOCUMENTS

| | | |
|---|---|---|
| 9,691,864 B1 | 6/2017 | Haase et al. |
| 10,355,126 B2 | 7/2019 | Blank |
| 2001/0035561 A1 | 11/2001 | Hirler et al. |
| 2014/0042518 A1* | 2/2014 | Shim ................ H01L 27/11521 438/422 |
| 2015/0221742 A1* | 8/2015 | Yi ....................... H01L 29/4236 257/295 |
| 2017/0338338 A1 | 11/2017 | Blank et al. |
| 2022/0223601 A1* | 7/2022 | Lin .................. H01L 21/28123 |
| 2022/0310814 A1* | 9/2022 | Hsiung ............ H01L 29/42376 |

* cited by examiner

METHOD OF PRODUCING A SEMICONDUCTOR DEVICE

BACKGROUND

Semiconductor devices, such as transistor devices, may be used for various applications, such as switches in power supplies and power converters. Examples of transistor devices include a Metal Oxide Semiconductor Field Effect Transistor (MOSFETs) and an Insulated Gate Bipolar Transistor (IGBT). It is desirable that the semiconductor devices, including transistor devices have a good and reliable performance.

SUMMARY

In an embodiment, a semiconductor device comprises a semiconductor substrate having a first major surface, a trench extending from the first major surface into the semiconductor substrate and having a base and a side wall extending form the base to the first major surface, a field plate arranged in the trench and an enclosed cavity in the trench. The enclosed cavity is defined by insulating material and is laterally positioned between a side wall of the field plate and the side wall of the trench.

In an embodiment, a method comprises forming a trench in a first major surface of a semiconductor substrate, the trench having a base and a side wall extending from the base to the first major surface, forming a first insulating layer on the base and the side wall of the trench, forming a sacrificial layer on the first insulating layer on the side wall of the trench, forming a second insulation layer on the sacrificial layer, inserting conductive material into the trench that at least partially covers the second insulation layer, selectively removing portions of the second insulation layer uncovered by the conductive material, selectively removing the sacrificial layer to form a recess that is positioned adjacent the conductive material in the trench and that is bounded by the first insulation layer and the second insulating layer and forming a third insulating layer in the trench that caps the recess to form an enclosed cavity in the trench.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In high power applications, two device parameters of a transistor device that play a substantial role in overall performance of the device are on-state resistance (RON) and breakdown voltage (VBR). Lower on-state resistance RON is a desirable characteristic because it minimizes the resistive power loss and corresponding heat generation that occurs when the device is in a forward conducting state. Meanwhile, a high breakdown voltage VBR is a desirable characteristic because it determines how much voltage the device can safely block in an OFF state.

Power transistors typically include a lightly doped drift region between the output regions (e.g., source/drain regions) that substantially determines the breakdown voltage of the device. In the case of a vertical switching device (i.e., a device that is configured to conduct between opposite facing main and rear surfaces of the substrate), the drift region occupies most of the thickness of the substrate. The properties of the drift region can be tailored to achieve a desired trade-off between on-state resistance and breakdown voltage. For example, by reducing the doping concentration of the drift region, the breakdown voltage the device can be improved. However, this comes at the expense of increased on-state resistance RON. Conversely, the doping concentration of the drift region can be increased to lower the on-state resistance at the expense of a reduced breakdown voltage VBR.

Field electrodes or field plates are used in power switching devices to favorably shift the trade-off between on-state resistance and breakdown voltage. Field electrodes utilize the compensation principle to balance charges during operation of the device. By tying the field electrode to a fixed potential (e.g., source potential) during the OFF state of the device, charges in the drift region are compensated for by corresponding charges in the field electrode. This charge balancing technique makes the device less susceptible to avalanche breakdown than would otherwise be the case in the absence of a field electrode. As a result, the doping concentration of the drift region can be increased, and thus the on-state resistance of the device reduced, without detrimentally impacting the voltage blocking capability of the device.

It is also desirable to reduce the size of the transistor device. The possible reduction in the cell pitch, that is the size of the trench and mesa forming the elementary cell of the transistor structure, is limited by FOM (Figure of Merit) reduction trade-off. The Figure of Merit (FOM) is the product of Rdson (the on-state resistance) and the gate charges Qg.

A reduction in the mesa width requires an enhanced doping of the drift region to meet the charge balance criteria and control the location where avalanche occurs (usually at trench bottom). The corresponding increased doping has a positive effect on the on-state resistance "Rdson" but also a negative (non-linear) effect on the gate charges "Qg". Therefore, there is a limit in reducing the mesa width to reach the lowest FOMg as FOM is a product of Rdson and Qg. Further scaling of the mesa could lead to even a FOM increase.

While reducing the trench width, both Qg and Rdson can be scaled linearly in a way that the FOM can be kept constant while the area & costs are still reduced. The trench width can be then seen as the sum of the width of the field plate electrode and the widths of the insulating layer on each side of the electrode. Both dimensions can be considered separately. The resistance of the field plate electrode should remain within a certain range, firstly, to ensure the source is well clamped to the ground potential in off state and secondly to ensure an integrated snubber function against ringing in high frequency applications. Depending on the material being used, for the field plate electrode, usually polysilicon, a minimum cross section i.e. trench width is required to keep the resistance under control. The use of a metal or of a silicide to replace partially or totally the polysilicon used for field plate electrode material may be considered to help to reduce the cross-section of the electrode and therefore the trench width.

The isolation between the field plate electrode and the drain region, also referred to as the field oxide, should sustain the high electrical fields caused by the voltage difference in blocking mode. Depending on the material being used, usually silicon dioxide, the minimum oxide thickness required correlates to the maximum breakdown voltage of the device. The use of an insulating material with a lower permittivity may be considered in order to reduce the physical width of the insulating layer and of the trench.

According to embodiments described herein, an insulating material having a greater thickness at the trench bottom and an insulation material—gap (cavity)—insulation material stack on the trench sidewall is provided. This structure is used in order to enable a reduction in the trench width compared to a full silicon dioxide layer. The insulating material at the bottom of the trench may be grown using a LOCOS (Local Oxidation of Silicon) process to ensure mechanical stability. This combination of features facilitates the realization of the cavity structure while ensuring good mechanical stability. The structure may be used to decrease the width of the trench and/or increase the breakdown voltage of the device.

Figure 1:
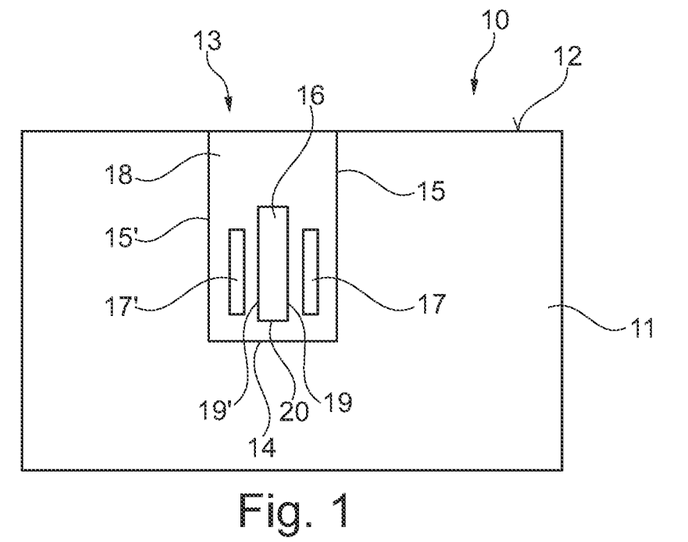
FIG. 1 illustrates a schematic view of a semiconductor device according to an embodiment.

FIG. 1 illustrates a schematic cross-sectional view of a semiconductor device 10 which includes a semiconductor substrate 11 having a first major surface 12. A trench 13 extends from the first major surface 12 into the semiconductor substrate 11. The trench 13 has a base 14 and a sidewall 15 extending from the base 14 to the first major surface 12. A field plate 16 is arranged in the trench and an enclosed cavity 17 is also arranged in the trench 13. The enclosed cavity 17 is bounded by insulating material 18 and is laterally positioned between the field plate 16 and the sidewall 15 of the trench 13. The insulating material 18 fills the remaining part of the trench 13 between the field plate 16 and cavity 17 and between the cavity 17 and the side wall 15 of the trench 13.

The enclosed cavity 17 is defined by the insulating material 18 and may be laterally positioned between a sidewall 19 of the field plate 16 and the sidewall 15 of the trench 13. The enclosed cavity 17 may include a vacuum and provide have better electrical isolation properties, for example a lower permittivity, than the insulating material 18 which bounds and defines the enclosed cavity 17.

The insulating material 18 which bounds and defines the enclosed cavity 17 may be arranged on the side wall 19 of the field plate 16, on the side wall 15 of the trench 13 and on the base 14 of the trench 13. The insulating material 18 also extends from a sidewall 19 of the field plate 16 to the sidewall 15 of the trench 13 to cap and form the enclosed cavity 17. The insulating material 18 may entirely fill the trench 13 in regions unoccupied by the field plate 16 and the enclosed cavity 17. The enclosed cavity 17 may, therefore, be defined by a plurality of layers of insulating material which together define an enclosed cavity 17 which is free of the insulating material and may include a vacuum or a gas. The insulating material may include an oxide, for example silicon oxide.

The semiconductor substrate 11 may be a semiconductor wafer, for example a silicon single crystal wafer, or may be a monocrystalline semiconductor layer, for example a silicon epitaxial layer.

In some embodiments, the trench 13 is an elongate trench extending into the plane of the drawing. The field plate 16 also has an elongate form extending into the plane drawing and has a substantially rectangular form with the sidewalls 19, 19' defining the height and the spacing between the side walls 19, 19' defining the breadth of field plate 16. The enclosed cavity 17 may be positioned between the first sidewall 19 of the field plate 16 and the sidewall 15 of the trench 13 facing the first sidewall 19 of the field plate 16. The enclosed cavity 17 may also have an elongated form extending into the plane of the drawing.

In some embodiments, a single cavity 17 may be formed which has a continuous ring type shape in plan view which laterally and continuously surrounds the field plate 16 within the trench 13 and, in particular, laterally and continuously surrounds the side faces 19, 19' of the field plate 16 within the trench 13. In some embodiments, a second cavity 17 is provided on the opposing side of field plate 16 between the opposing side face 19' of the field plate 16 and the opposing portion 15' of the sidewall 15 of the trench 13.

In some embodiments, the trench 13 is a columnar trench. The columnar trench 13 may be described as a needle trench. The field plate 16 may also have a columnar structure and may have a lateral form corresponding to the lateral form of the columnar trench 13 or may have a lateral form which differs from the lateral form of the columnar trench 13, for example the columnar trench 13 may be substantially square and the columnar field plate 16 substantially circular in plan view. The enclosed cavity 17 may have a ring type form which surrounds the sidewall 19 of the columnar field plate 16 in the columnar trench 13. The field plate 16 may have lateral area which is substantially the same throughout its height. In some embodiments, the field plate 16 and/or the columnar trench 13 may taper towards the base to provide a specular or needle-like form.

A columnar trench 13 may have various forms in plan view. For example, the columnar trench may be circular, square, or hexagonal in plan view. In embodiments in which the trenches have a columnar structure, the trenches may be arranged in a two-dimensional array in plan view, for example in rows and columns which may be aligned, for example to form a square grid array or a rectangular grid array, or adjacent rows may be offset, for example to produce a hexagonal close packed type array.

The trench structure illustrated in FIG. 1 may be used in a transistor device, such as a MOSFET so that in some embodiments, the semiconductor device further comprises a drift region, a body region on the drift region, a source region on the body region and a gate electrode. The gate electrode may be positioned in a trench that is spaced apart from the trench including the cavity and which extends into the source region and the body region from the first major surface. The trench including the enclosed cavity may extend into the drift region and have a greater depth than the gate electrode trench. A highly doped region may be arranged on the second major surface of the semiconductor substrate which opposes first major surface. The highly doped region may provide the drain electrode of the MOSFET device.

The drift region may include a first conductivity type, the body region a second conductivity type which opposes first conductivity type, and the source region include the first conductivity type, whereby the source region is more highly doped than the drift region. For example, the drift region and source region may have a n-type conductivity and the body region p-type conductivity.

In some embodiments including columnar trenches, the columnar trenches may include only a field plate and separate elongate strip-like trenches may be provided for the gate. In some embodiments, rows of columnar trenches including a field plate may be arranged on either side of an elongate trench including a gate. The columnar trenches including the field plate may be spaced at intervals on either side of the strip-like elongate trench including the strip-like elongate gate. In some embodiments, a trench having the form of a grid may be provided for the gate and columnar trenches including a field plate may be arranged on either side of the trench including a gate such that a columnar trench is arranged in each cell defined by the grid of the gate trench.

Figure 2:
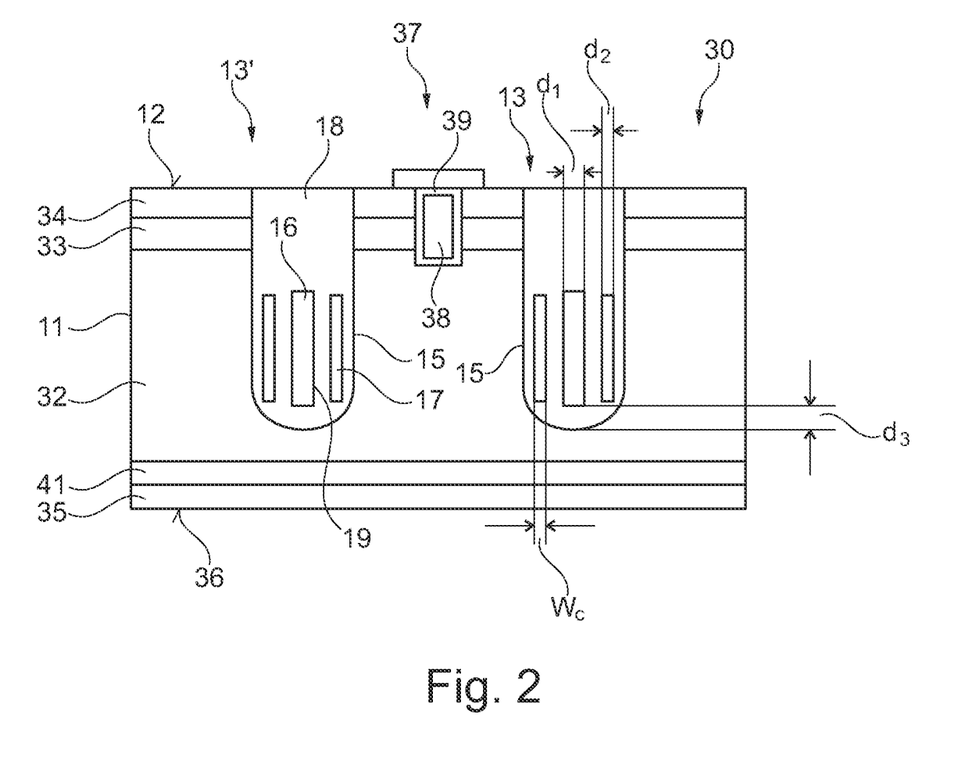
FIG. 2 illustrates a schematic view of a semiconductor device according to an embodiment.

FIG. 2 illustrates a schematic cross-sectional view of a semiconductor device 30 including a plurality of trenches 13, each including a field plate 16 and an enclosed cavity 17 bounded by insulating material 18. Neighbouring trenches 13 define a mesa 31 between the sidewalls 15 of joining trenches 13, 13'. In this embodiment, the semiconductor device 30 is a vertical MOSFET device in which the semiconductor substrate 11 includes drift region 32 having a first conductivity type, a body region 33 arranged on the drift region 32, the body region 33 including a second conductivity type which opposes the first conductivity type and a source region 34 arranged on the body region 33. The source region 34 has the first conductivity type. The MOSFET device 30 also includes a highly doped region 35 of first conductivity type at the rear surface 36 of the semiconductor substrate 11 which forms a drain region. The drain region 35 may form the second major surface 36 or may be positioned between the semiconductor substrate 11 and a further substrate. A further layer 41 that is more lightly doped with the first conductivity type than the drift region 35 may be positioned between the drain region 35 and the drift region 32.

The mesa 31 includes the body region 33 and source region 34 and further includes a gate electrode trench 37 which extends from the first major surface 12 of the semiconductor substrate 11 into the semiconductor substrate 11 and is bounded by the source region 34 and body region 33. The gate electrode trench 37 includes a gate electrode 38 and is lined by an insulation material, for example a gate oxide 39

The transistor device 30 includes a field oxide structure in the trenches 13 that includes the insulating material 18 and the enclosed cavity 17.

In some embodiments, the insulating material 18 has a thickness $d_1$ on the sidewall 19 of field plate 16, a thickness $d_2$ on the sidewall 15 of the trench 13 and a thickness $d_3$ between the base 14 of the trench 13 and a bottom 20 of the field plate 16. The thickness $d_3$ of the insulative material 18 positioned between the bottom 20 of the field plate 16 and the base 14 of the trench 13 may be greater than the thickness $d_1$, $d_2$ of the insulating material positioned on the sidewall 19 of the field plate 16 and on the sidewall 15 of the trench 13, respectively. The thickness $d_3$ the insulating material 18 positioned between the bottom 20 of the field plate 16 and the base 14 of the trench 13 may be selected in order to ensure mechanical stability of the enclosed cavity 17.

In some embodiments, the thicknesses of the insulating material 18 may be 10 nm≤$d_1$≤650 nm, 10 nm≤$d_2$≤650 nm, 30 nm≤$d_3$≤2000 nm. The cavity may have a width $w_c$, wherein 10 nm≤$w_c$≤650 nm.

Figure 3:
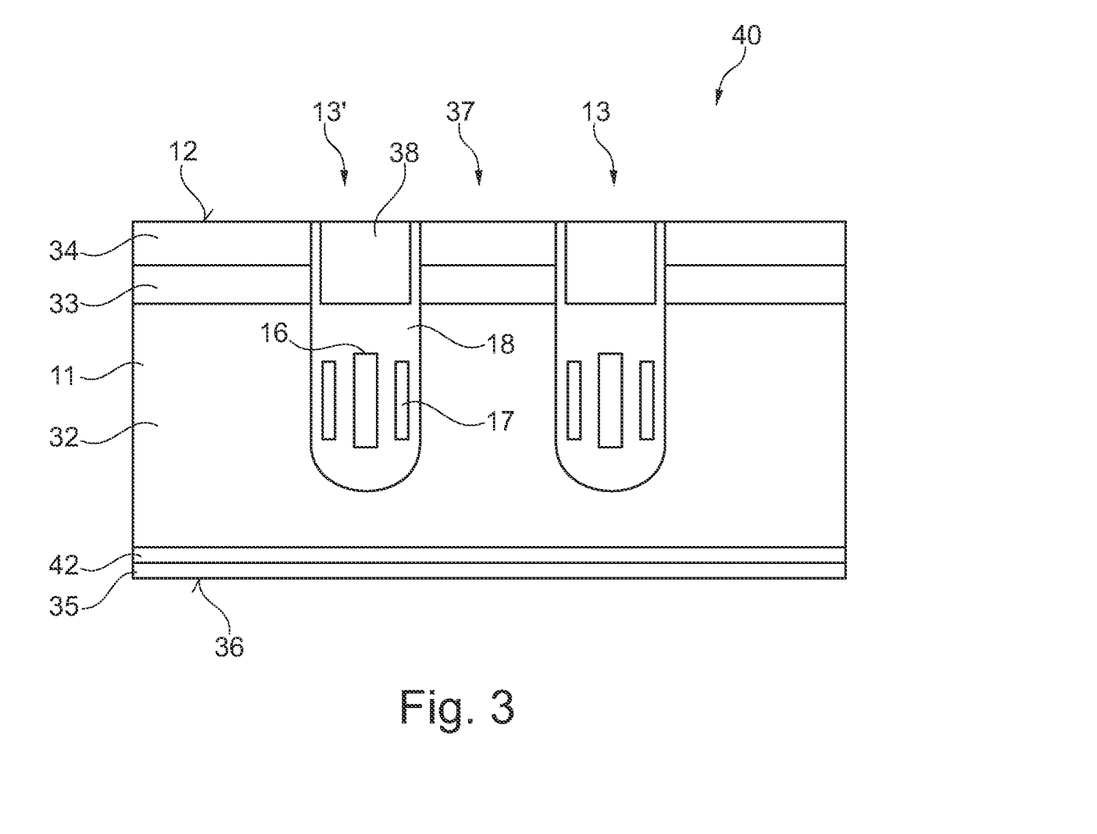
FIG. 3 illustrates a schematic view of the semiconductor device according to an embodiment.

FIG. 3 illustrates a semiconductor device 40 according to an embodiment which is a vertical MOSFET device. The semiconductor device 40 includes plurality of trenches 13, each including a field plate 16 and an enclosed cavity 17 in a semiconductor substrate 11 including a drift region 32, a body region 33, a source region 34 and a drain region 35 as in the embodiment illustrated in FIG. 2. In the semiconductor device 40, the gate electrode 38 is positioned in the trench 13 above the field plate 16 and above the enclosed cavity 17 and is spaced apart and electrically insulated from the field plate 16 and the enclosed cavity 17 by a portion of the insulating material 18.

The transistor device 40 also includes a field oxide structure in the trenches 13 that includes the insulating material 18 and the enclosed cavity 17.

A method of fabricating the trench 13 and enclosed cavity 17 will now be described with reference to FIGS. 4A to 4L.

Figure 4A:
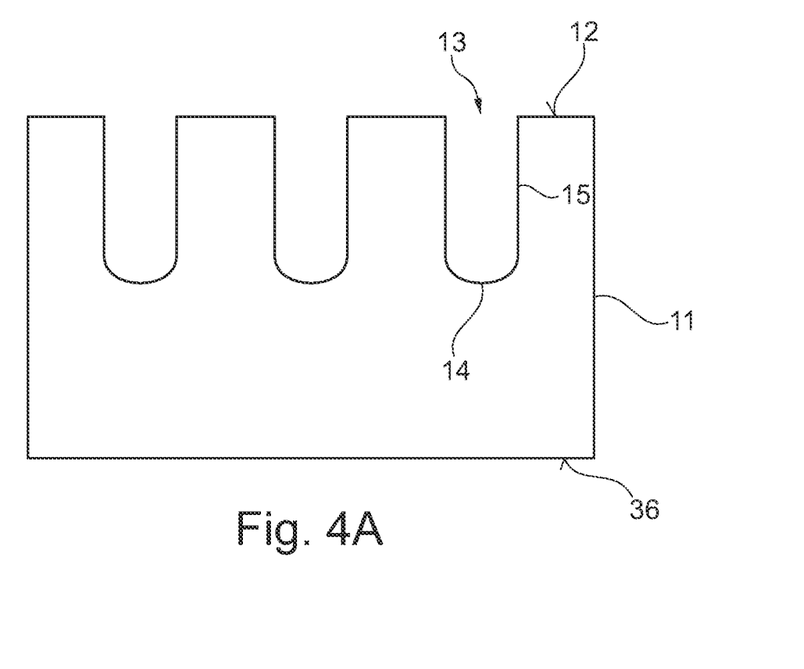
FIGS. 4A to 4L illustrate a method for fabricating a trench in a semiconductor device.

FIG. 4A illustrates a semiconductor substrate 11 including a first major surface 12 and second major surface 36 which opposes the first major surface. One or more trenches 13 are formed in the first major surface 12 of the semiconductor substrate 11, each trench 13 having a base 14 and sidewall 15 extending from the base 14 to the first major surface 12.

The trench 13 may be formed by etching. Each trench 13 is defined by a single side wall 15 surrounding the base 14. For an elongate trench 13, the side wall 15 includes four wall portions and defines a rectangular trench 13.

Figure 4B:
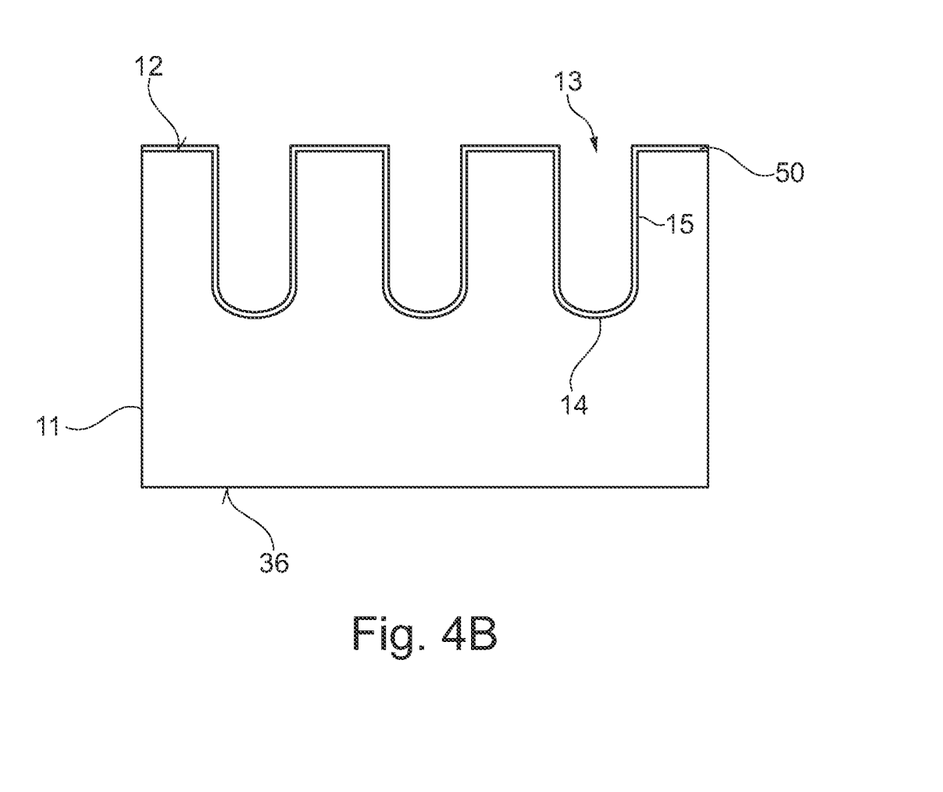

FIG. 4B illustrates the formation of a first insulating layer 50 on the base 14 and sidewall 15 of the trench 13 as well as on the first major surface 12 of the substrate 11 in regions between the trenches 13 which form the mesas 31. The first insulating layer 50 may include an oxide and may be formed by oxidation of the semiconductor substrate 11. In the case of the semiconductor substrate 11 being a silicon wafer or silicon epitaxial layer, the first insulating layer 50 is silicon oxide. Alternatively, the oxide the insulating layer 50 may be formed by deposition of the insulating material on the base 14 and sidewall 15 of the trench 13 and on the first major surface 12.

Figure 4C:
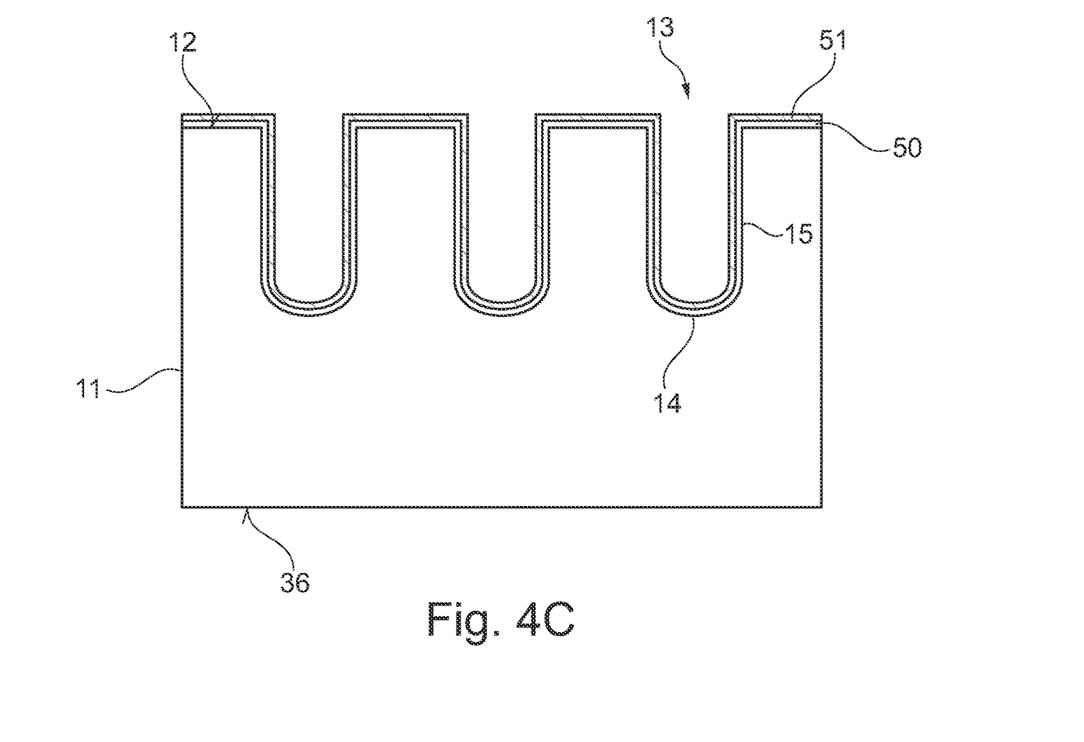

FIG. 4C illustrates the formation of a sacrificial layer 51 on the first insulating layer 50. In the illustrated embodiment, the sacrificial layer 51 covers the first insulating layer 50 on the sidewall 15 of the trench 13 as well as on the base 14 of the trench 13 and on the first major surface 12. The sacrificial material 51 may include a nitride, for example a silicon nitride.

Figure 4D:
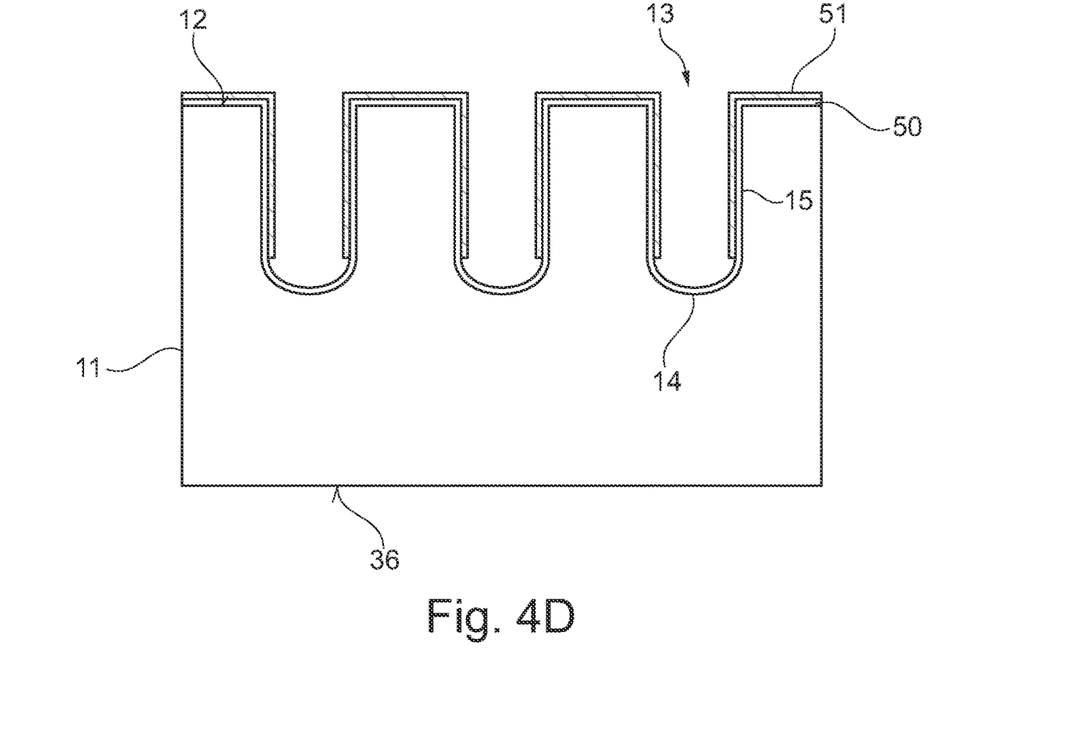

FIG. 4D illustrates the removal of the sacrificial layer at the base of the trench 13 so as to reveal a portion of the underlying insulating material of the first insulating layer 50 lining the base 14 of the trench 13. The sacrificial material 51 remains on the sidewall 15 of the trench 13 and first major surface 12. In embodiments in which the sacrificial material 51 is a nitride, the sacrificial layer 51 may be removed by etching.

Figure 4E:
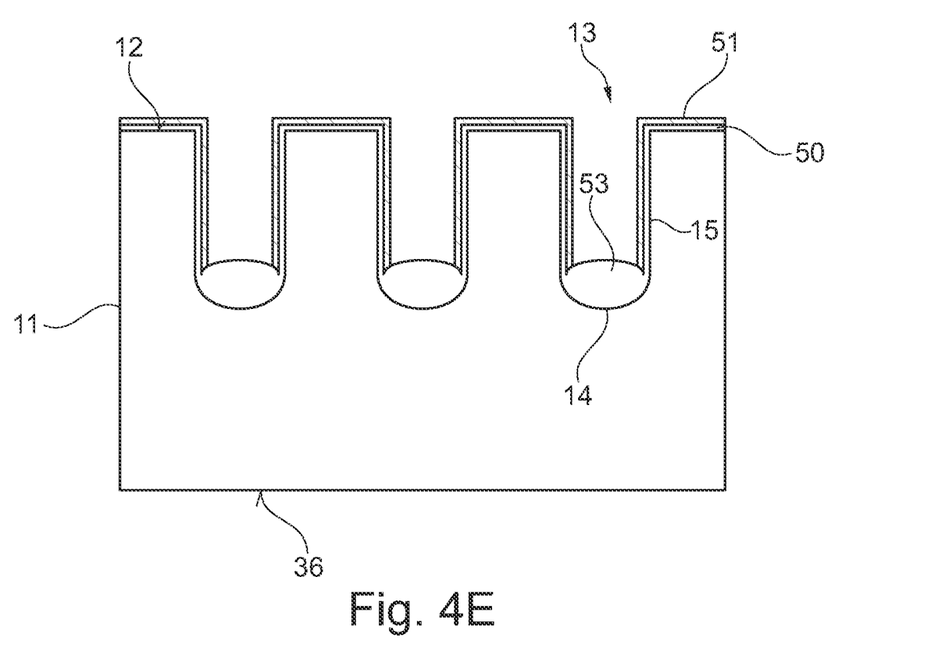

FIG. 4E illustrates the increase in the thickness of the portion 53 of the first insulating layer 50 at the base 14 of the trench 13. In some embodiments, the increase in thickness of this portion 53 of the first insulating layer 50 is achieved by oxidation of the material of the semiconductor substrate 11, for example, by forming silicon oxide in a LOCOS process. In other embodiments, an additional insulating layer may be formed by deposition, for example by high density plasma deposition of an insulating material, for example a silicon oxide. The total thickness of the portion 53 of the insulating material at the base of the trench 14 is now greater than the thickness of the first insulating layer 51 positioned on the sidewall 53 of the trench 13. The increased thickness of the insulating material at the base 14 of the trench 13 may assist in improving the mechanical stability of the subsequently formed cavity.

Figure 4F:
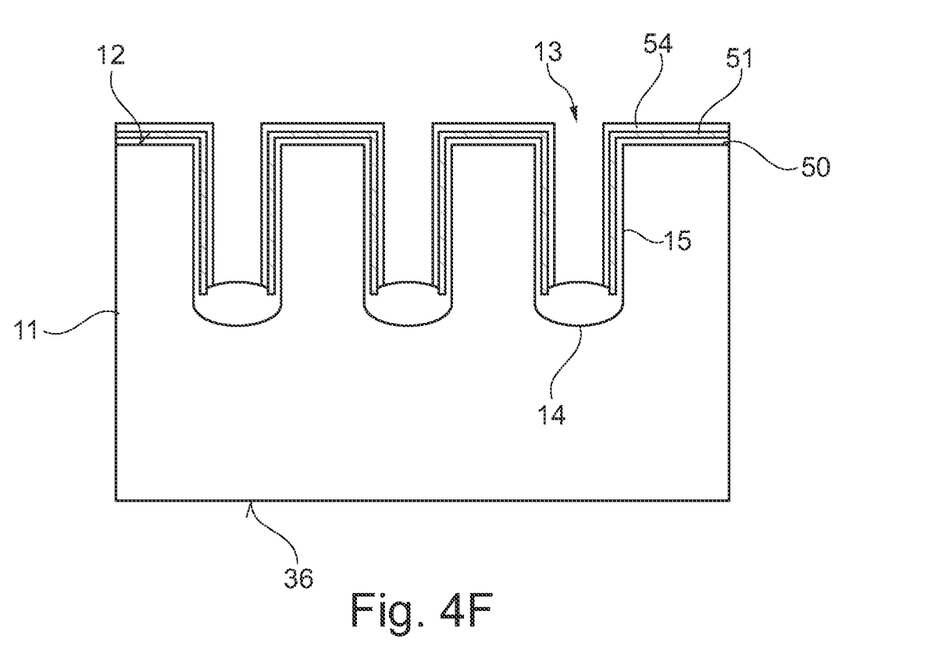

FIG. 4F illustrates the deposition of a second insulation layer 54 on the sacrificial layer 51. The second insulation layer 54 may be conformally deposited and over the sacrificial layer 51 on the first major surface 12 and on the side wall 15 of the trench 13 and on the thicker portion 53 of insulating material at the base 14 of the trench 13. The second insulating layer 54 may be formed by high-density plasma deposition, for example, and may be silicon oxide.

Figure 4G:
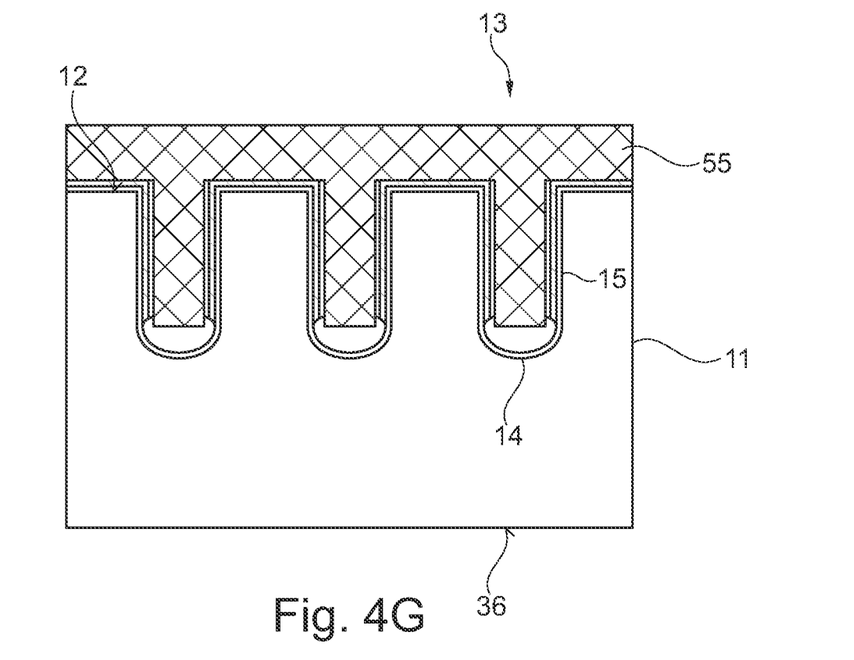

FIG. 4G illustrates a conductive material 55, for example polysilicon, which has been inserted into the trenches 13. The conductive material 55 is in contact with the second insulating layer 54 in the trenches 13 and may entirely fill the trenches 13 and may also cover the first major surface 12 of the semiconductor substrate 11.

Figure 4H:
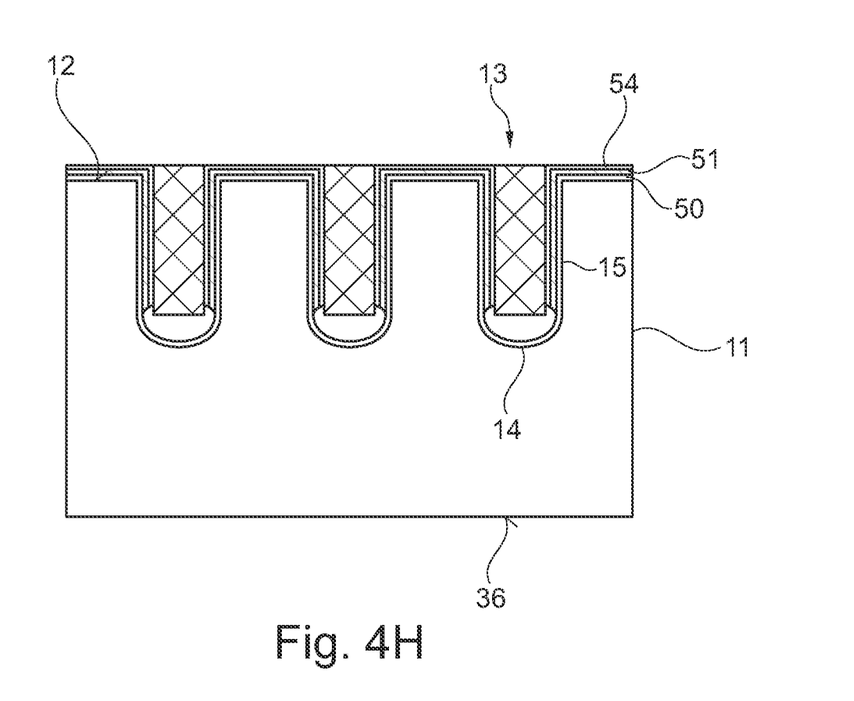

FIG. 4H illustrates removal of the conductive material 55 arranged on the first major surface 12, for example by chemical mechanical polishing to produce a planarized surface. The second insulating layer 54 may act as a stop for the chemical mechanical polishing process.

Chemical mechanical polishing (CMP) is a method in which the surface is ground or polished with use of a slurry having a composition including particles to remove material by mechanical or abrasive polishing and components selected to remove material by chemical reaction, for example by etching. The composition of the slurry may define the selectivity to other materials, for example to the second insulating layer 54, so that the conductive material 55 is removed and the second insulating layer 54 is removed at a sufficiently low rate that it acts as a stop layer.

Figure 4I:
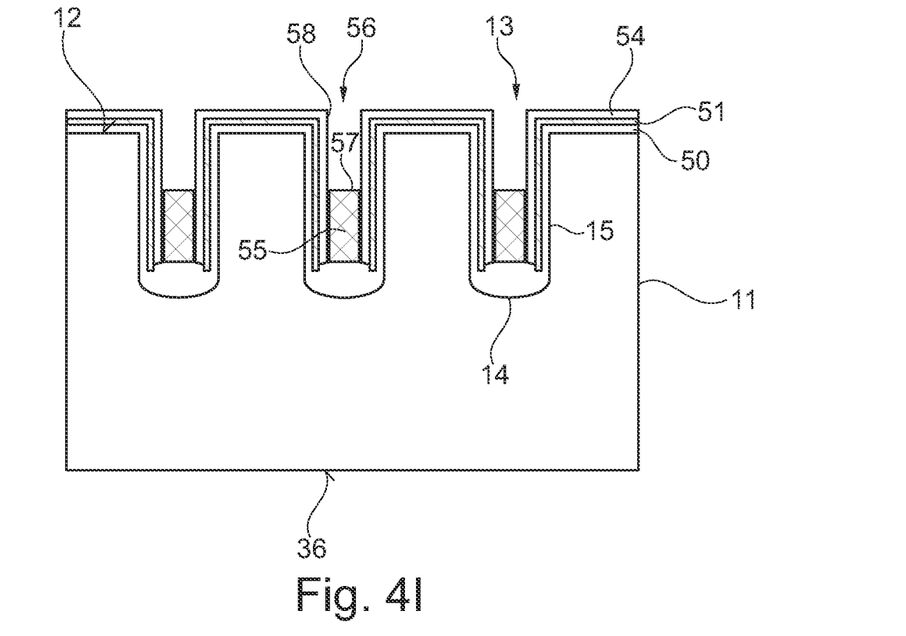

FIG. 4I illustrates the partial removal of the conductive material 55 within the trench 13. This produces a recess 56 at the top of the trench 13 and adjacent the first major surface 12 whereby the recess 56 includes a base 57 formed by the conductive material 53 and sidewalls 58 formed by the second insulating material 54. The remaining portion of the conductive material 55 in the lower portion of the trench 13 forms the field plate 16.

Figure 4J:
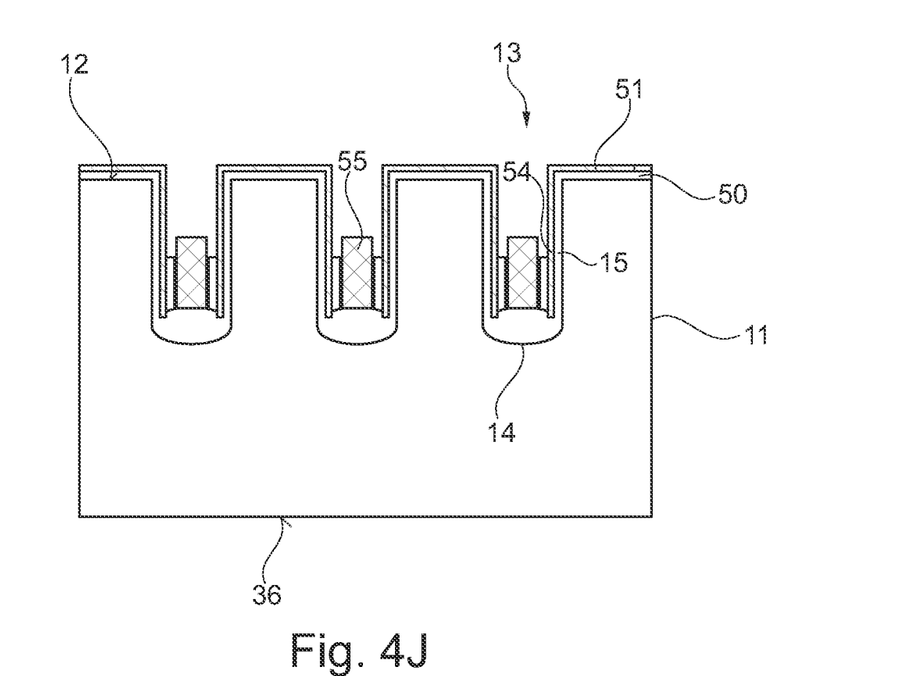

FIG. 4J illustrates the removal of the second insulating layer 54 from the sacrificial layer 51 on the first major surface 12 and sidewalls 58 of the recess 56 such that the second insulation layer 54 positioned adjacent the conductive material 55 is exposed and forms the base of an enlarged recess at the top of the trench 13. The second insulating layer 54 may be removed by wet etching, in embodiments in which it includes a silicon oxide, for example.

Figure 4K:
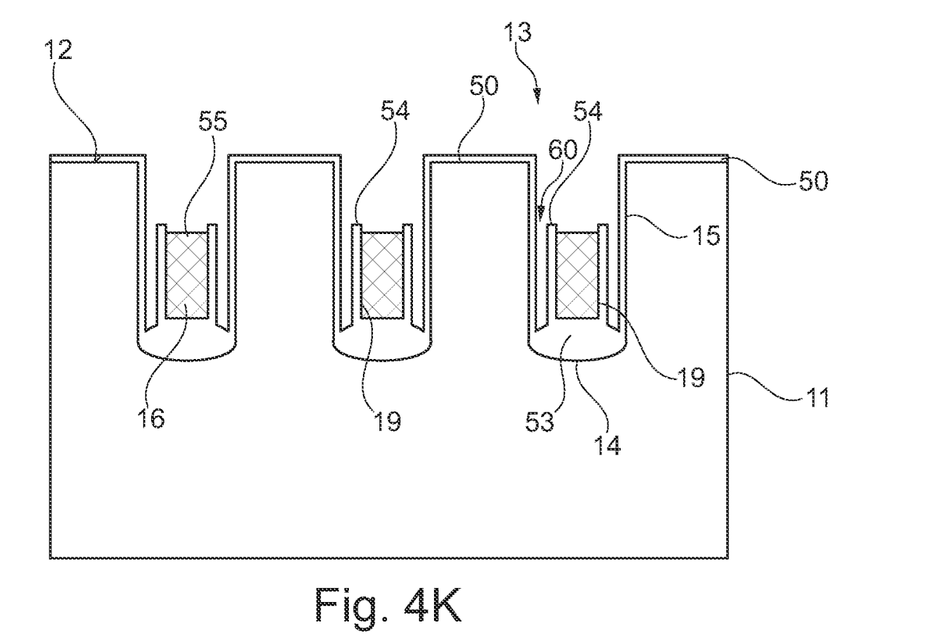

FIG. 4K illustrates the removal of the sacrificial material 51. In particular, the sacrificial material 51 is selectively removed, for example by wet etching, from the first major surface 12 and sidewalls 15 of the trench 13. The sacrificial layer 51 is also removed from the region between the first insulating layer 51 which lines the sidewall 15 of the trench 13 and the remaining portion of the second insulating layer 54 which is positioned on the side face 19 of the conductive material 55 forming the field plate 16. Thus, removal of the sacrificial material 54 forms a recess or indentation 60 laterally adjacent the conductive material 55. The recess 60 is laterally bounded by insulating material, in particular, the first insulating layer 50, the second insulating material 54 and has a base formed by the insulating material 53 formed at the base of the trench 13. The recess 60 is open at the top. If the sacrificial material 51 includes nitride, for example silicon nitride, it may be selectively used using wet etching, for example, hot phosphorus etch.

Figure 4L:
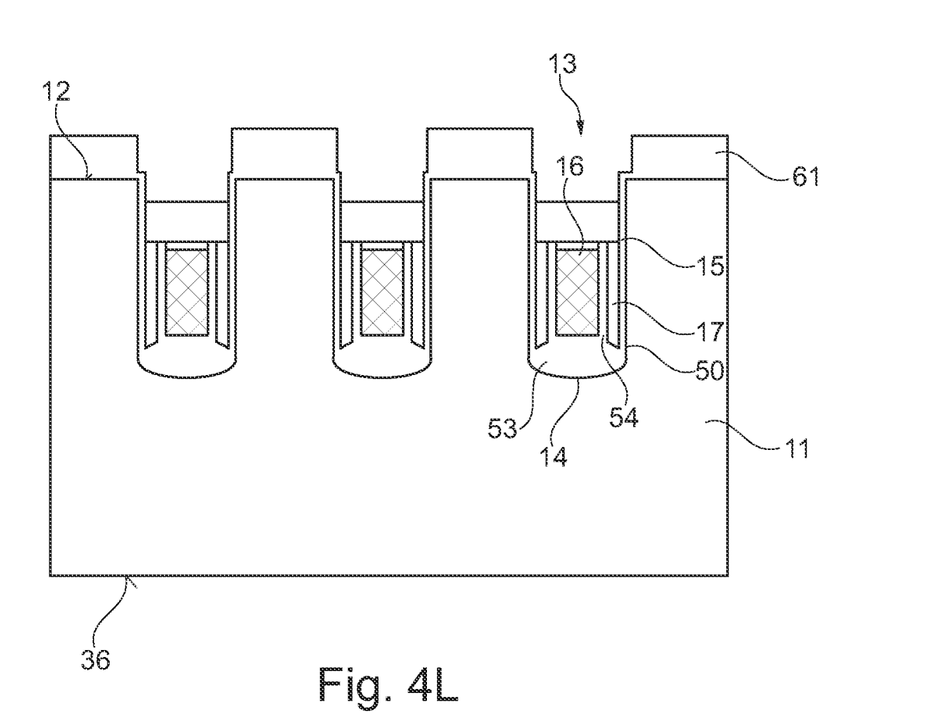

FIG. 4L illustrates the substrate 11 after the deposition of a third insulating layer 61 onto the first major surface 12 and into the trenches 13 which extends across the width of the trench 13 and caps the recess 60 formed between the second insulating layer 54 positioned on the conductive material 55 and the first insulating layer 50 positioned on the sidewall 15 of the trench 13 to form an enclosed cavity 17 which is defined by and bounded by insulating material.

The deposition conditions of the third insulating layer 61 are selected and controlled so that it is preferentially deposited on lateral surfaces compared to vertical surfaces and is able to cover and cap the recess 60 so as to form the cavity 17, rather than filling the recess 60 with insulating material. The further layer 61 may be formed by high density plasma process or a TEOS (Tetraethyl orthosilicate) process for forming silicon dioxide.

The trenches 13 thus formed include a field oxide structure including an insulating layer 50—cavity 17—insulating layer 54 lateral stack positioned between the side wall 19 of the conductive material 55 forming the field plate 16 and the semiconductor material of the substrate 11, in particular the side wall 15 of the trench 13. The enclosed cavity 17 can include a gas or vacuum and have a lower permittivity than the insulating material, for example, silicon oxide. A structure for the field oxide is provided within the trench 13 that has a lower average permittivity than pure silicon oxide.

Figure 5:
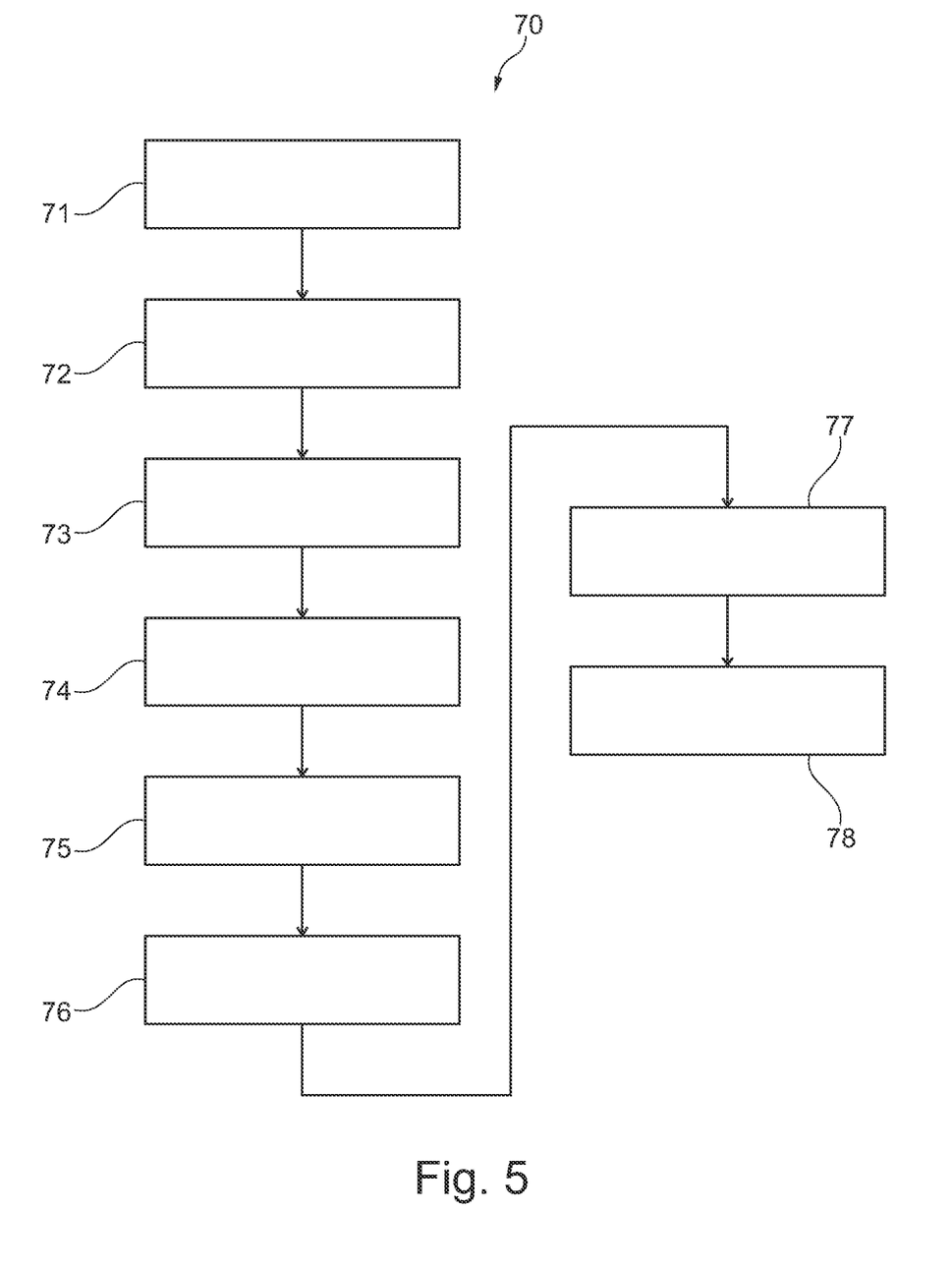
FIG. 5 illustrates a flowchart for fabricating a trench in a semiconductor substrate.

FIG. 5 illustrates a flowchart 70 for the fabrication of a field oxide structure within a trench in a semiconductor substrate, which may be used in a transistor device, such as a vertical MOSFET.

In block 71, a trench is formed in the first major surface of semiconductor substrate, the trench having a base and the sidewall extending from the base to the first major surface. In block 72, a first insulating layer is formed on the base and the sidewall of the trench. In block 73, a sacrificial layer is formed on the first insulating layer on the sidewall of the trench. In block 74, a second insulating layer is formed on the sacrificial layer. In block 75, conductive material is inserted into the trench that at least partially covers the second insulation layer. In block 76, portions of the second insulating layer that are uncovered by the conductive material are selectively removed. In block 77, the sacrificial layer is selectively removed to form a recess that is positioned adjacent the conductive material in the trench and that is bounded by the first insulation layer and the second insulating layer. In block 75, a third insulating layer is formed in the trench that caps the recess to form an enclosed cavity in the trench.

In some embodiments, the conductive material includes polysilicon and, the first, second and third insulating layers include silicon oxide and the sacrificial layer includes silicon nitride.

The second insulating layer and the sacrificial layer may be removed by selective etching. The etch solution for removing the second insulating layer may selectively remove the second insulating layer compared to the conductive material and sacrificial layer. The etch solution used to selectively remove the sacrificial layer may selectively remove the material of the sacrificial layer compared to the material of the first and second insulating layers as well as the conductive material.

For example, the etch solution used for removing the second insulating layer may have an etch selectivity of greater than 1000 over the material of the sacrificial layer, the material of the second insulating layer having the higher etching rate. The etch solution used for removing the sacrificial layer may have an etch selectivity of greater than 1000 over the material of the first and second insulating layers, the material of the sacrificial layer having the higher etching rate.

In some embodiments, the sacrificial layer is conformally deposited and formed on the first insulating layer on the base and on the sidewall of the trench and then the sacrificial layer is selectively removed from the base of the trench, whereby sacrificial layer remains on the sidewall of the trench. In some embodiments, the method further includes increasing the thickness of the first insulating layer that is exposed from the sacrificial layer and positioned on the base of the trench. The thickness of the first insulating layer may be increased by selectively oxidising the material of the semiconductor wafer at the base of the trench or by depositing fourth insulating layer on the base of the trench.

In some embodiments, the third insulating layer, which is used to cap the recess and form the enclosed cavity in the trench, is applied preferentially to lateral surfaces using a high-density plasma process.

In some embodiments, inserting the conductive material into the trench comprises filling the trench with conductive material, planarizing the first major surface by removing conductive material from the first major surface and exposing the second insulating layer and by removing conductive material from an upper portion of the trench.

In the embodiments described above, the drift region may have a doping concentration which is usefully in the range of $1.10^{14}$ cm$^{-3}$ to $1.10^{18}$ cm$^{-3}$, conveniently in the range of $7.10^{14}$ cm$^{-3}$ to $3.10^{17}$ cm$^{-3}$, and more conveniently in the range of $1.10^{15}$ cm$^{-3}$ to $1.10^{16}$ cm$^{-3}$, but higher or lower doping concentrations may also be used. The drain region may have doping concentration usefully at least $5.10^{19}$ cm$^{-3}$, conveniently at least $1.10^{20}$ cm$^{-3}$ and more conveniently at least $3.10^{20}$ cm$^{-3}$, but higher or lower doping concentrations may also be used. The source region may have doping concentration usefully of at least $5.10^{19}$ cm$^{-3}$, conveniently of at least $1.10^{20}$ cm$^{-3}$, and more conveniently of at least $3.10^{20}$ cm$^{-3}$, but higher or lower doping concentrations may also be used. The body region may have doping concentration usefully in the range of $1.10^{17}$ cm$^{-3}$ to $1.10^{20}$ cm$^{-3}$, conveniently in the range of $2.10^{17}$ cm$^{-3}$ to $7.10^{18}$ cm$^{-3}$, and more conveniently in the range of $5.10^{17}$ cm$^{-3}$ to $5.10^{18}$ cm$^{-3}$, but higher or lower doping concentrations may also be used.

To summarize, according to embodiments described herein, a trench structure for a transistor device is provided in which the insulating material has a greater thickness at the trench bottom and an insulation layer—cavity—insulating layer lateral stack is used between the field plate in the trench and the trench sidewall. This combination of features facilitates the realization of the structure while ensuring good mechanical stability. The structure may be used to decrease the width of the trench and/or increase the breakdown voltage of the transistor device.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    forming a trench in a first major surface of a semiconductor substrate, the trench having a base and a sidewall extending from the base to the first major surface;
    forming a first insulating layer on the base and the sidewall of the trench;

forming a sacrificial layer on the first insulating layer on the side wall of the trench;

forming a second insulation layer on the sacrificial layer;

inserting conductive material into the trench that at least partially covers the second insulation layer;

selectively removing portions of the second insulation layer uncovered by the conductive material;

selectively removing the sacrificial layer to form a recess that is positioned adjacent the conductive material in the trench and that is bounded by the first insulation layer and the second insulating layer; and forming a third insulating layer in the trench that caps the recess to form an enclosed cavity in the trench.

2. The method of claim 1, wherein the second insulating layer and the sacrificial layer are removed by selective etching.

3. The method of claim 1, wherein the conductive material comprises polysilicon, wherein the first insulating layer, the second insulating layer and the third insulating layer comprise silicon oxide, and wherein the sacrificial layer comprises silicon nitride.

4. The method of claim 1, wherein the sacrificial layer is formed on the first insulating layer on the base of the trench.

5. The method of claim 4, further comprising:
before forming the second insulation layer on the sacrificial layer, selectively removing the sacrificial layer from the base of the trench.

6. The method of claim 5, further comprising:
increasing the thickness of the first insulating layer that is exposed from the sacrificial layer and positioned on the base of the trench.

7. The method of claim 6, wherein increasing the thickness of the first insulating layer comprises:
selectively oxidising a material of the semiconductor wafer at the base of the trench.

8. The method of claim 6, wherein increasing the thickness of the first insulating layer comprises:
depositing a fourth insulating layer on the base of the trench.

9. The method of claim 6, wherein the second insulation layer is conformally deposited over the sacrificial layer on the first major surface and on the side wall of the trench and on the portion of insulating material with the increased thickness at the base of the trench.

10. The method of claim 9, wherein the second insulating layer is formed by high-density plasma deposition and comprises silicon oxide.

11. The method of claim 5, wherein the first insulating layer comprises silicon oxide, and wherein the sacrificial layer comprises silicon nitride.

12. The method of claim 5, wherein the sacrificial layer is selectively removed from the base of the trench by etching.

13. The method of claim 5, wherein the sacrificial layer is conformally deposited on the first insulating layer on the base and on the side wall of the trench.

14. The method of claim 1, wherein the third insulating layer is applied to lateral surfaces using a high-density plasma process.

15. The method of claim 1, wherein inserting the conductive material into the trench comprises:
filling the trench with the conductive material;
planarizing the first major surface by removing the conductive material from the first major surface;
exposing the second insulating layer; and
removing the conductive material from an upper portion of the trench.

16. The method of claim 1, wherein the first insulating layer, the second insulating layer and the third insulating layer comprise silicon oxide, and wherein the sacrificial layer comprises silicon nitride.

17. The method of claim 1, wherein the sacrificial layer is conformally deposited and formed on the first insulating layer on the base and on the side wall of the trench, and wherein the sacrificial layer is selectively removed from the base of the trench.

18. The method of claim 17, further comprising:
increasing the thickness of first insulating layer that is exposed from the sacrificial layer and positioned on the base of the trench.

19. The method of claim 18, wherein increasing the thickness of the first insulating layer comprises:
selectively oxidising a material of the semiconductor wafer at the base of the trench.

20. The method of claim 18, wherein increasing the thickness of the first insulating layer comprises:
depositing a fourth insulating layer on the base of the trench.

* * * * *